(12) United States Patent
Chen

(10) Patent No.: US 7,138,702 B2
(45) Date of Patent: Nov. 21, 2006

(54) INTEGRATED CIRCUIT CHIP

(75) Inventor: Sheng-Yow Chen, Taichung (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 11/407,106

(22) Filed: Apr. 20, 2006

(65) Prior Publication Data

US 2006/0197214 A1   Sep. 7, 2006

Related U.S. Application Data

(62) Division of application No. 10/991,476, filed on Nov. 19, 2004.

(30) Foreign Application Priority Data

Nov. 25, 2003   (TW) .............................. 92133104 A

(51) Int. Cl.
*H01L 23/544* (2006.01)
(52) U.S. Cl. ...................................... 257/620; 257/629

(58) Field of Classification Search ................ 257/620, 257/629, 678, 688
See application file for complete search history.

(56) References Cited

U.S. PATENT DOCUMENTS

| | | | | |
|---|---|---|---|---|
| 6,303,977 | B1 * | 10/2001 | Schroen et al. ............. | 257/635 |
| 6,376,899 | B1 * | 4/2002 | Seshan et al. .............. | 257/620 |
| 6,566,736 | B1 * | 5/2003 | Ogawa et al. ............. | 257/620 |
| 6,815,821 | B1 * | 11/2004 | Yu .............................. | 257/758 |

* cited by examiner

*Primary Examiner*—Thanhha S. Pham
(74) *Attorney, Agent, or Firm*—Rabin & Berdo, PC

(57) ABSTRACT

An integrated circuit chip is provided. The chip includes a silicon substrate, a circuit, a seal ring, a ground ring and a guard ring. The circuit is formed on the silicon substrate and has an input/output (I/O) pad. The seal ring is formed on the silicon substrate and surrounds the circuit and the I/O pad. The ground ring is formed between the silicon substrate and the I/O pad, and the ground ring is electrically connected with the seal ring. The guard ring is formed above the silicon substrate and surrounds the I/O pad, and the guard ring is electrically connected with the seal ring.

13 Claims, 7 Drawing Sheets

US 7,138,702 B2

INTEGRATED CIRCUIT CHIP

This is a Divisional of U.S. application Ser. No. 10/991,476, filed Nov. 19, 2004, the subject matter of which is incorporated herein by reference.

This application claims the benefit of Taiwan application Serial No. 92133104, filed Nov. 25, 2003, the subject matter of which is incorporated herein by reference.

BACKGROUND OF THE INVENTION

1. Field of the Invention

The invention is related to an integrated circuit (IC) chip, and more particularly to an integrated circuit chip having a seal ring, a ground ring and a guard ring.

2. Description of the Related Art

A semiconductor wafer comprises a number of integrated circuit chips formed through integrated circuit manufacturing process with each integrated circuit chip comprises a number of circuits, such as digital circuits, analog circuits and radio frequency (RF) circuits. A scribing line is formed between any two adjacent integrated circuit chips to facilitate the scribing of integrated circuit chips. When scribing the integrated circuit chip, the generated stress will cause damage to the circuits of the integrated circuit chip. Therefore, a seal ring is normally formed between the integrated circuit chip and the scribing line to prevent the integrated circuit chip from being damaged during the scribing process.

Refer to FIG. 1A and FIG. 1B. FIG. 1A is a top view of a conventional integrated circuit chip. FIG. 1B is a partial enlargement of a cross-sectional view of the integrated circuit chip along the cross-sectional line 1B–1B' in FIG. 1A. In FIG. 1A and FIG. 1B, an integrated circuit chip 10 includes a silicon substrate 14, a digital circuit 12, an RF circuit 13, a seal ring 11, two input/output (I/O) pads 12a and 13a. The digital circuit 12, the RF circuit 13, the seal ring 11, the I/O pads 12a and 13a are formed on the silicon substrate 14. Of which, the I/O pads 12a and 13a are respectively electrically connected with the digital circuit 12 and the RF circuit 13. The seal ring 11 surrounds the integrated circuit chip 10 and encloses the digital circuit 12, the RF circuit 13, the I/O pads 12a and 13a. As shown in FIG. 1B, the seal ring 11 includes a P well 15, a P+ doping layer 16, three metal layers 17a~17c, three dielectric layers 18a~18c, three vias 19a~19c, a passivation layer 18d, and a nitride layer 18e. The P well 15 is formed on the silicon substrate 14. The P+ doping layer 16 is formed in the P well 15 and the surface of the P+ doping layer 16 is co-planar with the surface of the P well 15. The dielectric layers 18a~18c, the passivation layer 18d, and the nitride layer 18e are formed on the surface of the P well 15 and the surface of the P+ doping layer according to a bottom-up sequence. The metal layers 17a~17c are respectively formed on the dielectric layers 18a~18c and are respectively covered by the dielectric layers 18b, 18c and the passivation layer 18d. The vias 19a~19c are respectively formed in the dielectric layers 18a~18c. The via 19a is electrically connected with the P+ doping layer 16 and metal layer 17a. The via 19b is electrically connected with the metal layers 17a and 17b. The via 19c is electrically connected with the metal layer 17b and 17c.

Since the seal ring 11 is a continuous ring structure, the digital circuit 12 is a circuit, which easily generates noises. Moreover, the RF circuit 13 is a circuit which is easily interrupted by the noise, so that the noise generated by the digital circuit 12 or the I/O pad 12a will be easily transmitted to the RF circuit 13 or the I/O pad 13a through the seal ring 11, resulting in noise coupling and further affecting the normal operation of the RF circuit 13.

Several conventional methods have been provided to resolve the noise-coupling problem disclosed above. Refer to FIG. 2A and FIG. 2B. FIG. 2A is a partial top view of an integrated circuit chip disclosed in US Patent Publication No. US 2003/0122235 A1. FIG. 2B is a partial enlargement of a cross-sectional view of the integrated circuit chip along the cross-sectional line 2B–2B' in FIG. 2A. In FIG. 2A and FIG. 2B, an integrated circuit chip 20 includes a silicon substrate 25, an I/O pad 22 of a digital circuit, a ground pad 24, an RF circuit 23, two seal rings 21a and 21b. The I/O pad 22 of the digital circuit, the ground pad 24, the RF circuit 23, the seal rings 21a and 21b are formed on the silicon substrate 25. The seal rings 21a and 21b surround the integrated circuit chip 20 and enclose the I/O pad 22 of the digital circuit, the ground pad 24 and the RF circuit 23. The seal ring 21a and 21b are two discontinuous rings. The seal ring 21b is formed closer to the I/O pad 22 of the digital circuit, the ground pad 24 and the RF circuit 23 than the seal ring 21a is. To prevent the noise generated by the I/O pad 22 of the digital circuit from being transmitted to the RF circuit 23 through the seal rings 21a and 21b, the gaps of the seal rings 21a and 21b are alternately arranged. The I/O pad 22 of the digital circuit and the RF circuit 23 are formed corresponding to the seal ring 21a through the two gaps of the seal ring 21a. The ground pad 24 is formed near the seal ring 21b.

The seal ring 21a and 21b have the same sectional structure, and the sectional structure of the seal ring 21b is exemplified herein. As shown in FIG. 2B, the seal ring 21b includes a N well 26, a P+ doping layer 27, a salicide layer 28, a shallow trench isolation (STI) layer 29, six dielectric layers 30a~30f, six metal layers 34a~34f, six contact layer 35a~35f, a passivation layer 31, a nitride layer 32 and a polyimide (PI) layer 33. The N well 26 is formed on the silicon substrate 25. The P+ doping layer 27 and the STI layer 29 are formed in the N well 26. The surface of the P+ doping layer 27 and that of the STI layer 29 are co-planar with the surface of the N well 26. The STI layer 29 respectively enables the seal ring 21b and the I/O pad 22 of the digital circuit, the ground pad 24 and the RF circuit 23 to be electrically isolated from each other. The salicide layer 28 is formed in the P+ doping layer 27. The surface of the salicide layer 28 is co-planar with the surface of the P+ doping layer 27. The dielectric layers 30a~30f, the passivation layer 31, the nitride layer 32 and the PI layer 33 are respectively formed on the surfaces of the N well 26, the salicide layer 28 and the STI layer 29 according to a bottom-up sequence. The metal layers 34a~34f are respectively formed on the surfaces of the dielectric layers 30a~30f and are respectively covered by the dielectric layers 30b~30f and the passivation layer 31. The contact layers 35a~35f are respectively formed in the dielectric layers 30a~30f. The contact layer 35a is electrically connected the metal layer 34a and the salicide layer 28. The contact layers 35b~35f are respectively electrically connected any two adjacent metal layers of the metal layers 34b~34f according to a bottom-up sequence.

It is noteworthy that a PN junction is formed between the N well 26 and the silicon substrate 25, so the electric charges, which are generated during the process of manufacturing the seal rings 21a and 21b according to a plasma etching method, cannot be discharged through the silicon substrate 25 and will build up on the seal rings 21a and 21b, severely affecting the electrical characteristics of the integrated circuit chip 20. Moreover, the N well 26 formed underneath the gaps of the seal rings 21a and 21b is not cut off, so the noise generated by the I/O pad 22 of the digital circuit still can be transmitted to the RF circuit 23 through the N well 26, causing noise coupling to occur. Besides, the double ring design of the seal rings 21a and 21b will increase the size of the integrated circuit chip 20.

Refer to FIG. 3A and FIG. 3B. FIG. 3A is a partial top view of an integrated circuit chip disclosed in U.S. Pat. No. 6,492,716. FIG. 3B is a partial enlargement of a cross-sectional view of the integrated circuit chip along the cross-sectional line 3B–3B' in FIG. 3A. In FIG. 3A and FIG. 3B, an integrated circuit chip 40 includes a P type silicon substrate 44, a digital circuit 42, an RF circuit 43 and a seal ring 41. The digital circuit 42, the RF circuit 43 and the seal ring 41 are formed on the P type silicon substrate 44. The seal ring 41 surrounds the integrated circuit chip 40 and encloses the digital circuit 42 and the RF circuit 43. The seal ring 41 is a discontinuous ring structure and has a number of gaps, two gaps for instance, such that part of the seal ring 41 is adjacent to the digital circuit 42 and another part of the seal ring 41 is adjacent to the RF circuit 43.

As shown in FIG. 3B, the seal ring 41 includes an N well 45, a salicide layer 46, a gate oxide 47, an STI layer 48, a polysilicon layer 49, six dielectric layers 50a~50f, six metal layer 53a~53f, six vias 54a~54f, an oxide layer 51 and a nitride layer 52. The N well 45 and the STI layer 48 are formed on the P type silicon substrate 44. The salicide layer 46 is formed in the N well 45. The gate oxide 47 is formed in the salicide layer 46. The surface of the gate oxide 47 is co-planar with the surface of the STI layer 48. The dielectric layers 50a~50f, the oxide layer 51 and the nitride layer 52 are respectively formed on the surfaces of the gate oxide 47 and the STI layer 48 according to a bottom-up sequence. The polysilicon layer 49 and the metal layers 53a~53f are respectively formed on the dielectric layers 50a~50f and are respectively covered by the dielectric layers 50b~50f and the oxide layer 51. The contact layers 54a~54f are respectively formed in the dielectric layers 50a~50f. The contact layer 54a is electrically connected the metal layer 53a and the polysilicon layer 49. The contact layers 54b~54f are respectively electrically connected any two adjacent metal layers of the metal layers 53b~53f according to a bottom-up sequence.

Despite that the polysilicon layer 49 and the gate oxide 47 can reduce the noise coupling of the integrated circuit chip 40, the electric charges, which are generated during the process of manufacturing the seal ring 41 according to a plasma etching method, cannot be discharged through the P type silicon substrate 44 and will build up on the seal ring 41, severely affecting the electrical characteristics of the integrated circuit chip 40.

SUMMARY OF THE INVENTION

It is therefore an object of the invention to provide an integrated circuit chip. The design of mutual electrical connection between the seal ring, the ground ring and the guard ring not only reduces the noise coupling between the circuits and the I/O pad and the external thereof, but also prevents the build-up of electric charges generated during the plasma etching manufacturing process, hence improving the electrical characteristics of the integrated circuit chip.

According to the object of the invention, an integrated circuit chip, which includes a silicon substrate, at least a circuit, a seal ring, a ground ring and at least a guard ring, is provided. The circuit is formed on silicon substrate and has at least an input/output (I/O) pad. The seal ring is formed on the silicon substrate and surrounds the circuit and the I/O pad. The ground ring is formed between the silicon substrate and the I/O pad. The ground ring is electrically connected with the seal ring. The guard ring is formed on the silicon substrate and surrounds the I/O pad. The guard ring is electrically connected with the seal ring.

According the object of the invention, a seal ring is provided, wherein the seal ring surrounds an integrated circuit chip, which has a silicon substrate. The seal ring includes a P well, a N type doping layer, a P+ doping layer, an isolation layer, a number of dielectric layers and a number of metal layers. The P well is formed on the silicon substrate and has a first aperture. The N type doping layer is formed on the first aperture and is formed on the silicon substrate. The P+ doping layer is formed on the P well and has a second aperture. The second aperture corresponds to the N type doping layer. The isolation layer is formed in the second aperture and is formed on the N type doping layer. The dielectric layers are formed on the P+ doping layer. Each of the metal layers is formed on the corresponding dielectric layer and is electrically connected with the P+ doping layer. The metal layer has a gap, which exposes part of the surface of the isolation layer.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
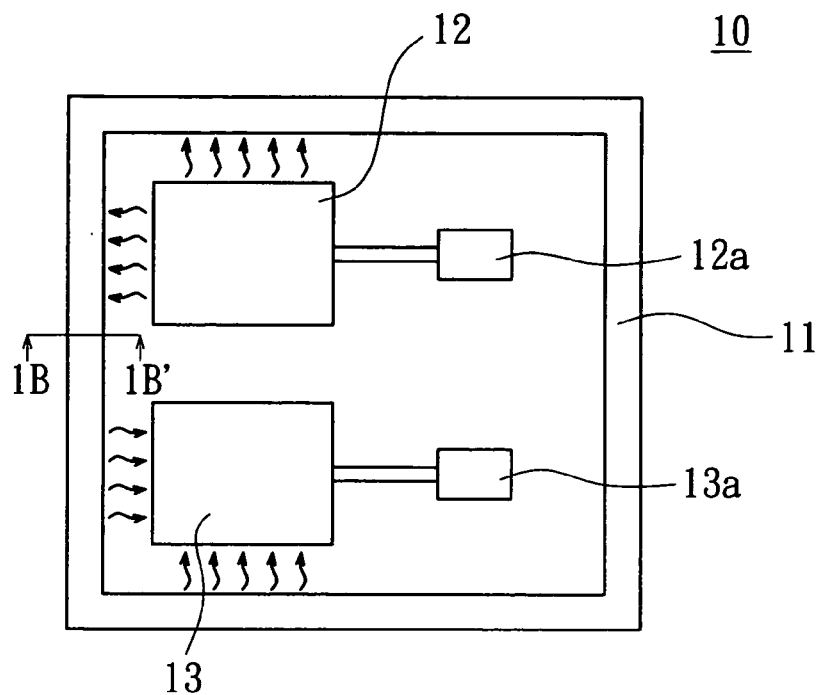
FIG. 1A(Prior Art) is a top view of a conventional integrated circuit chip.
Figure 1B:
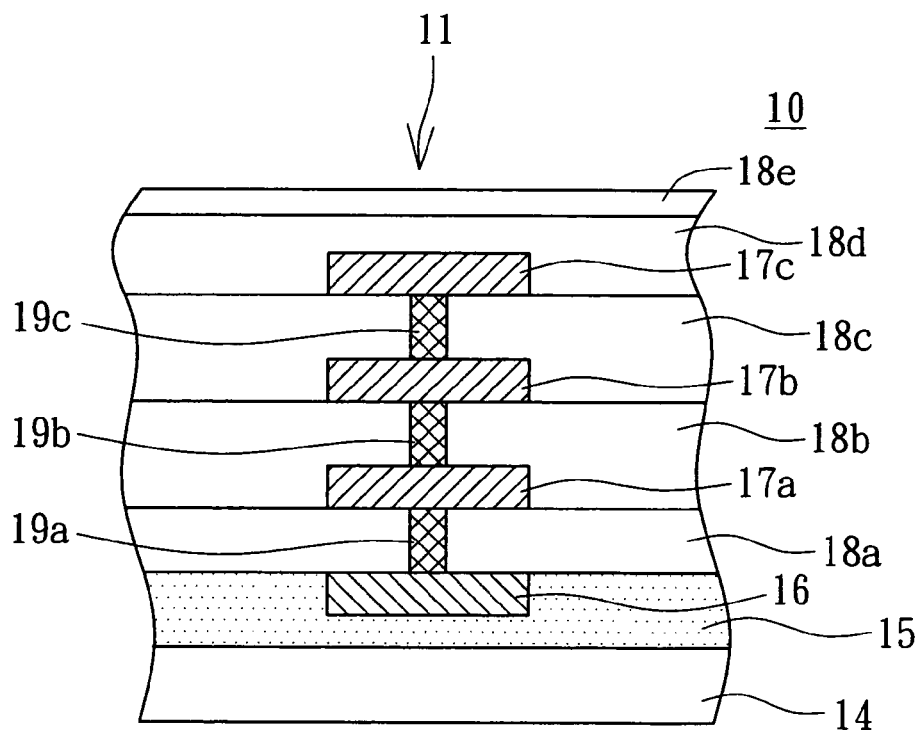
FIG. 1B(Prior Art) is a partial enlargement of a cross-sectional view of the integrated circuit chip along the cross-sectional line 1B–1B' in FIG. 1A.
Figure 2A:
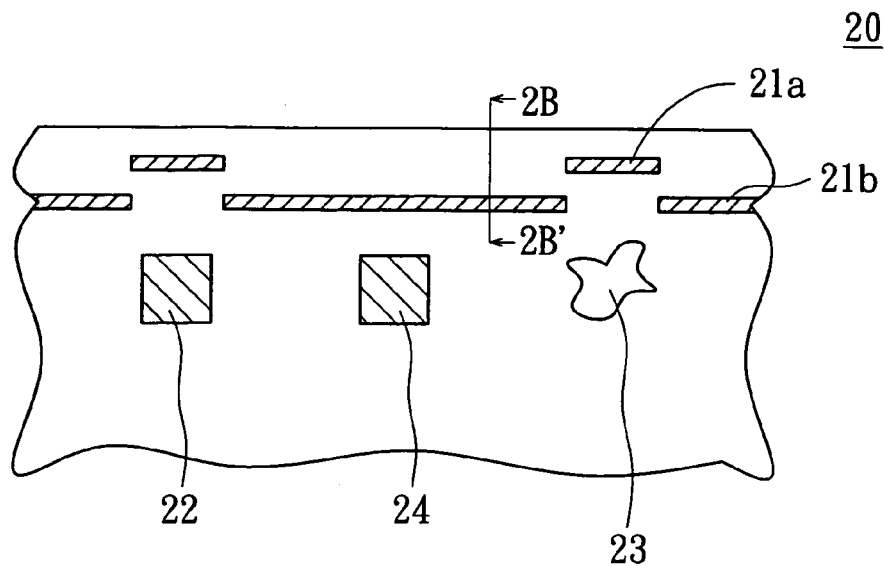
FIG. 2A(Prior Art) is a partial top view of an integrated circuit chip disclosed in U.S. Patent Publication No. US 2003/0122235 A1.
Figure 2B:
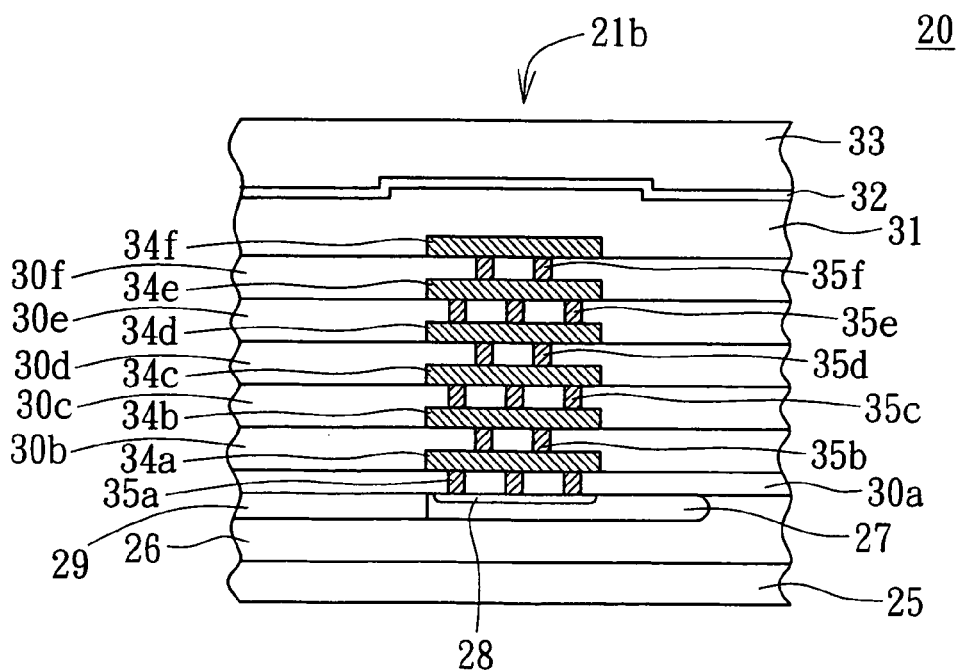
FIG. 2B(Prior Art) is a partial enlargement of a cross-sectional view of the integrated circuit chip along the cross-sectional line 2B–2B' in FIG. 2A.
Figure 3A:
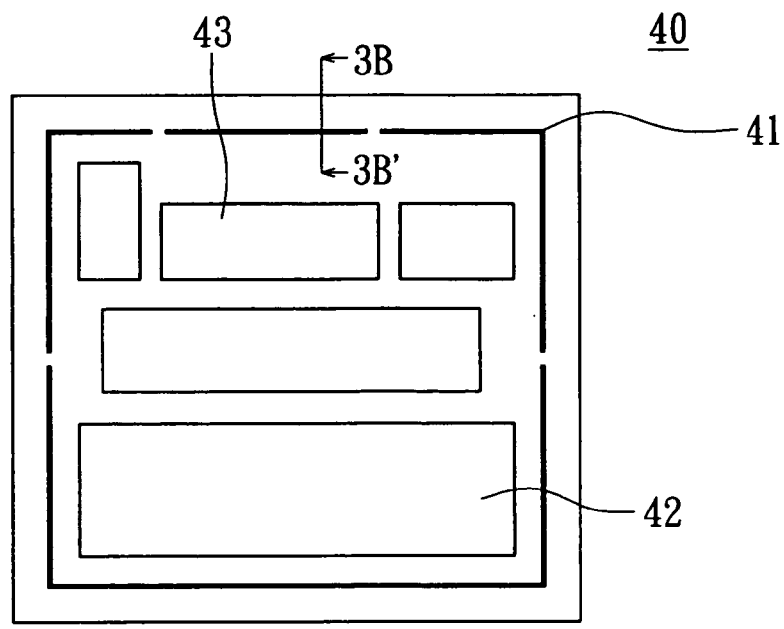
FIG. 3A(Prior Art) is a partial top view of an integrated circuit chip disclosed in U.S. Pat. No. 6,492,716.
Figure 3B:
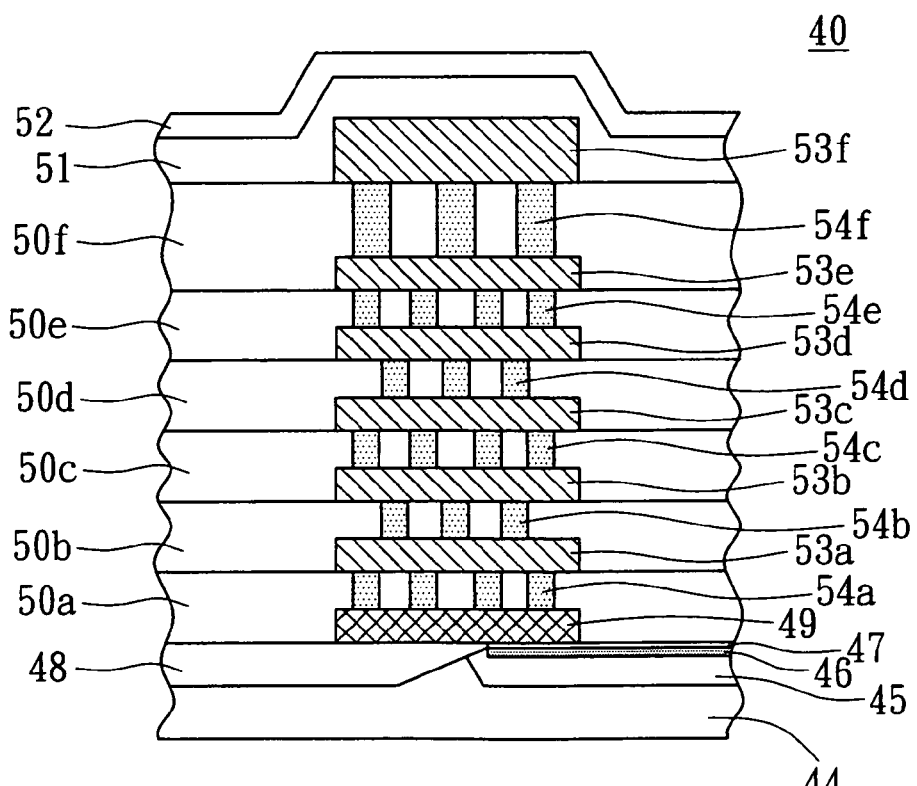
FIG. 3B(Prior Art) is a partial enlargement of a cross-sectional view of the integrated circuit chip along the cross-sectional line 3B–3B' in FIG. 3A.
Figure 4:
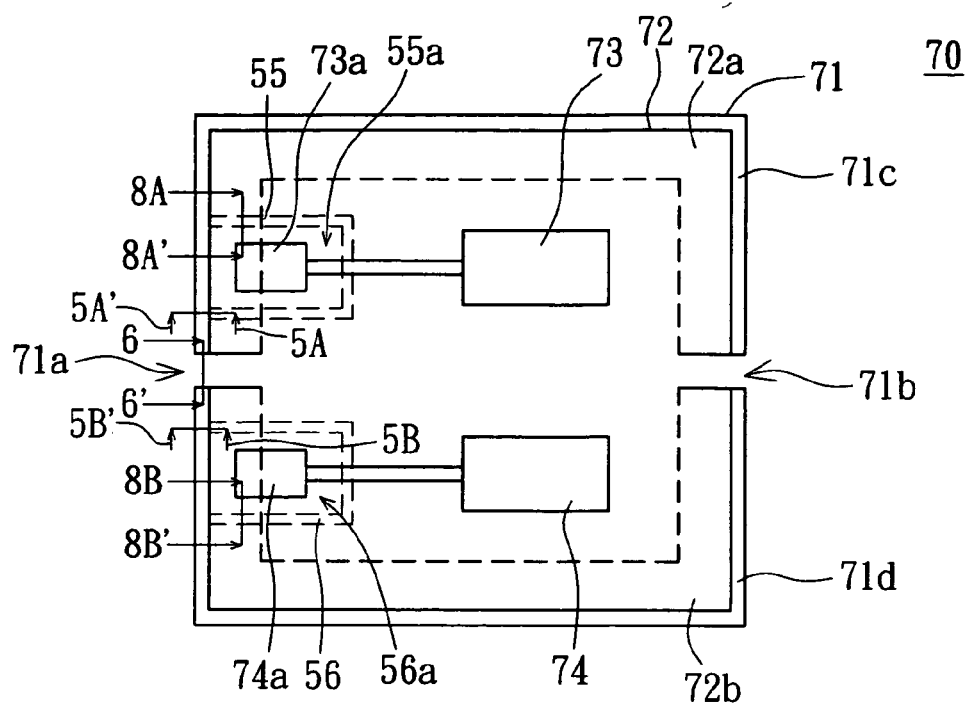
FIG. 4 is a top view of an integrated circuit chip according to a preferred embodiment of the invention.
Figure 5A:
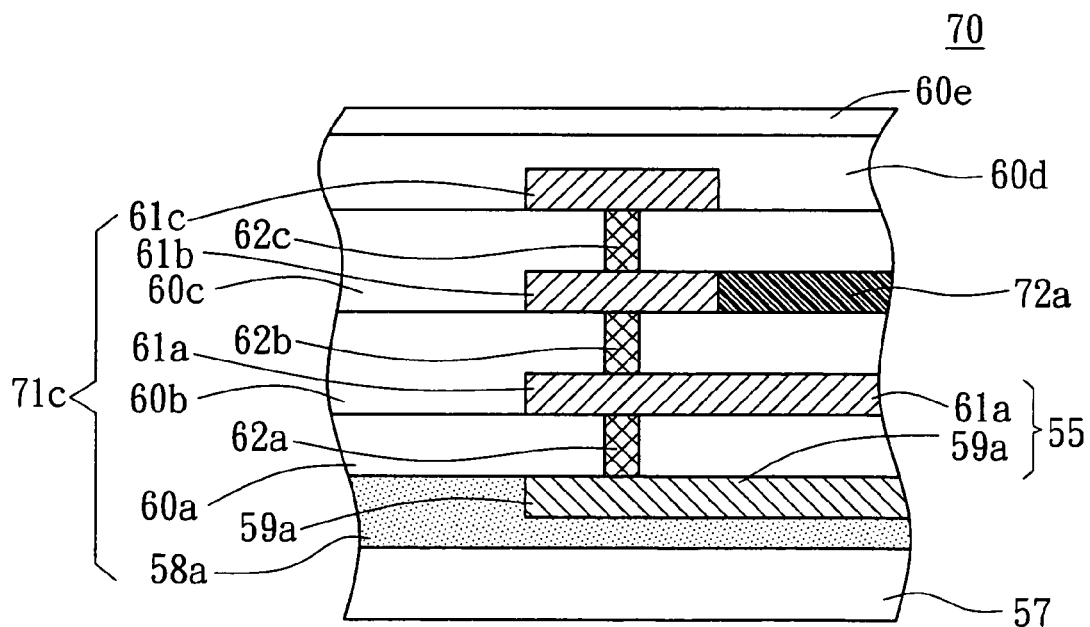
FIG. 5A is a partial enlargement of a cross-sectional view of the integrated circuit chip along the cross-sectional line 5A–5A' in FIG. 4.
Figure 5B:
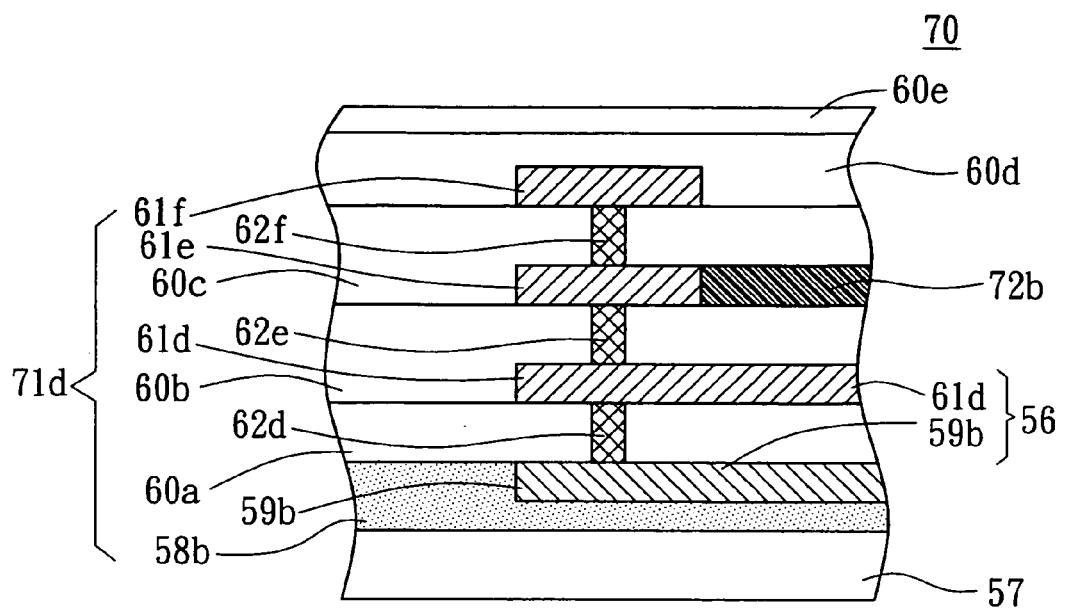
FIG. 5B is a partial enlargement of a cross-sectional view of the integrated circuit chip along the cross-sectional line 5B–5B' in FIG. 4.
Figure 6:
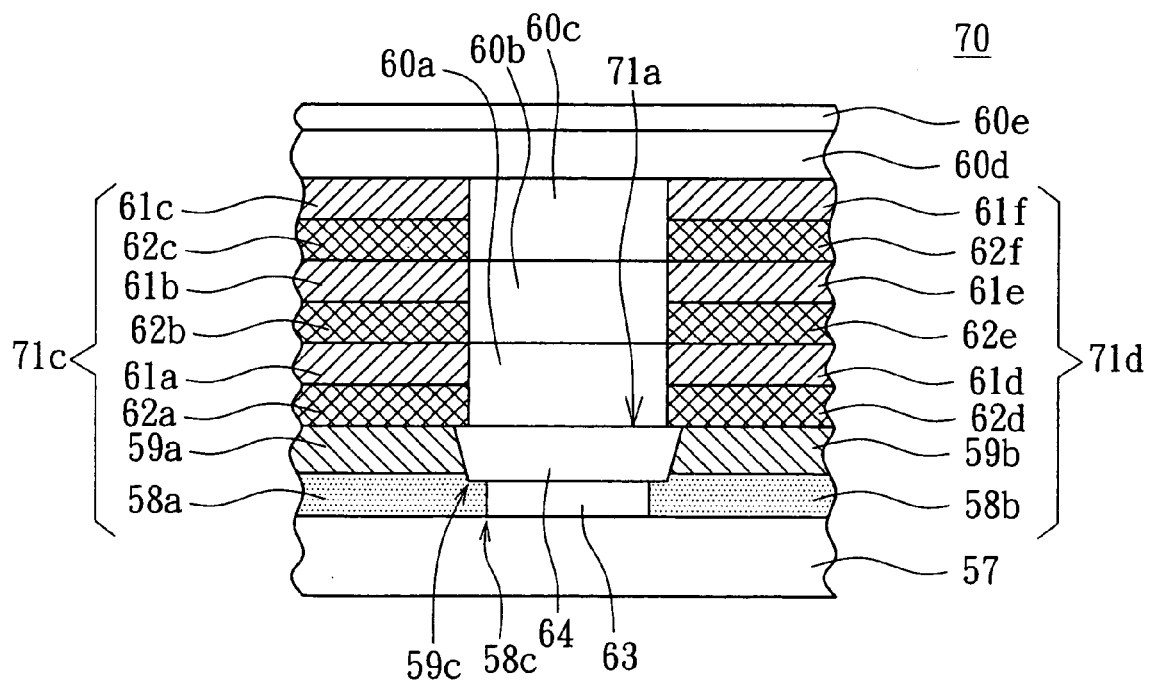
FIG. 6 is a partial enlargement of a cross-sectional view of the integrated circuit chip along the cross-sectional line 6–6' in FIG. 4.

Refer to FIGS. 4~6 at the same time. FIG. 4 is a top view of an integrated circuit chip according to a preferred embodiment of the invention. FIG. 5 is a partial enlargement of a cross-sectional view of the integrated circuit chip along the cross-sectional line 5–5' in FIG. 4. FIG. 6 is a partial enlargement of a cross-sectional view of the integrated circuit chip along the cross-sectional line 6–6' in FIG. 4. In FIGS. 4~6, an integrated circuit chip 70 includes a silicon substrate 57, a seal ring 71, a ground ring 72, at least a circuit, an input/output (I/O) pad of the circuit, and at least a guard ring, such as a digital circuit 73, a radio frequency (RF) circuit 74 and two guard rings 55 and 56 for instance. The digital circuit 73 and the RF circuit 74 respectively has an I/O pad 73a and 74a. The seal ring 71, the ground ring 72, the digital circuit 73, the RF circuit 74, the I/O pads 73a~74a and the guard rings 55~56 are all formed on the silicon substrate 57. The seal ring 71 surrounds the integrated circuit chip 70 and encloses the digital circuit 73, the RF circuit 74, the I/O pads 73a and 74a. The ground ring 72 is enclosed by the seal ring 71 and is electrically connected with the seal ring 71. Both the seal ring 71 and the ground ring 72 are two discontinuous ring structure and have at least a gap, gaps 71a and 71b for instance, so that the seal ring 71 is divided into a first seal ring 71c and a second seal ring 71d. The ground ring 72 is also divided into a first ground ring 72a and a second ground ring 72b. The second seal ring 71d and the second ground ring 72b are like two U-shaped structures. The first seal ring 71c and the first ground ring 72a are like two inverted U-shaped structures. Besides, the digital circuit 73 and the I/O pad 73a are adjacent to the first seal ring 71c and the first ground ring 72a. The RF circuit 74 and the I/O pad 74a are adjacent to the second seal ring 71d and the second ground ring 72b.

The guard ring 55 is formed near the first seal ring 71c and is electrically connected with the first seal ring 71c. The guard ring 55 is substantially a U-shaped structure. A first enclosed region 55a is enclosed by the guard ring 55 and part of the first seal ring 71c. Similarly, the guard ring 56 is formed near the second seal ring 71d and is electrically connected with the second seal ring 71d. The guard ring 56 is substantially a U-shaped structure. A second enclosed region 56a is enclosed by the second seal ring 71d and part of the second seal ring 71d. The I/O pad 73a is formed inside the first enclosed region 55a and the I/O pad 74a is formed inside the second enclosed region 56a.

Referring to FIG. 5A, a partial enlargement of a cross-sectional view of the integrated circuit chip along the cross-sectional line 5A–5A' in FIG. 4 is shown. In FIG. 5A, the first seal ring 71c surrounds partial peripheral of the integrated circuit chip 70 shown in FIG. 4 by extending along partial peripheral of the silicon substrate 57. The first seal ring 71c includes a first P well 58a, a first P+ doping layer 59a, a number of dielectric layers, a number of metal layers and a number of contact layers, such as the dielectric layers 60a~60c, the metal layers 61a~61c and the contact layers 62a~62c. The first P well 58a is formed on the silicon substrate 57. The first P+ doping layer 59a is formed in the first P well 58a. The surface of the first P+ doping layer 59a is co-planar with the surface of the first P well 58a. The dielectric layers 60a~60c are respectively formed on the surface of the first P well 58a and the surface of the first P+ doping layer 59a according to a bottom-up sequence. The metal layers 61a~61c are respectively formed on the dielectric layers 60a~60c. The metal layers 61a and 61b are respectively covered up by the dielectric layers 60b and 60c. Of which, the first ground ring 72a can be electrically connected with the metal layer 61b of the first seal ring 71a. The contact layers 62a is electrically connected with the first P+ doping layer 59a and the metal layer 61a. The contact layers 62b is electrically connected with the metal layer 61a and the metal layer 61b. The contact layers 62c is electrically connected with the metal layer 61b and the metal layer 61c. The contact layers 62a~62c can be vias or plugs. It is noteworthy that the integrated circuit chip 70 further includes an oxide layer 60d and a nitride layer 60e. The oxide layer 60d is formed on the dielectric layer 60c and covers the metal layer 61c. The nitride layer 60e is formed on the oxide layer 60d. The oxide layer 60d and the nitride layer 60e are the so-called passivation layer. Besides, the metal layer 61a and the first P+ doping layer 59a extend along the two sides of the I/O pad 73a in FIG. 4 from the first seal ring 71c and form the guard ring 55 shown in FIG. 4.

Referring to FIG. 5B, a partial enlargement of a cross-sectional view of the integrated circuit chip along the cross-sectional line 5B–5B' in FIG. 4 is shown. In FIG. 5B, the second seal ring 71d surrounds partial peripheral of the integrated circuit chip 70 shown in FIG. 4 by extending along partial peripheral of the silicon substrate 57. The second seal ring 71d includes a second P well 58b, a second P+ doping layer 59b, the dielectric layers 60a~60c, three metal layers 61d~61f and three contact layers 62d~62f. The second P well 58b is formed on the silicon substrate 57. The second P+ doping layer 59b is formed in the second P well 58b. The surface of the second P+ doping layer 59b is co-planar with the surface of the second P well 58b. The dielectric layers 60a–60c, the oxide layer 60d and the nitride layer 60e are respectively formed on the surface of the second P well 58b and the surface of the second P+ doping layer 59b according to a bottom-up sequence. The metal layers 61d~61f are respectively formed on the dielectric layers 60a~60c and are respectively covered by the dielectric layers 60b~60c and the oxide layer 60d. Of which, the second ground ring 72b can be electrically connected with the metal layer 61e of the second seal ring 71d. The contact layers 62d is electrically connected with the second P+ doping layer 59b and the metal layer 61d. The contact layers 62e is electrically connected with the metal layers 61d and 61e. The contact layers 62f is electrically connected with the metal layers 61e and 61f. The contact layers 62d~62f can be vias or plugs. It is noteworthy that the metal layer 61d and the second P+ doping layer 59b extend along the two sides of the I/O pad 74a in FIG. 4 from the second seal ring 71d and form a guard ring 56 shown in FIG. 4.

Figure 7:
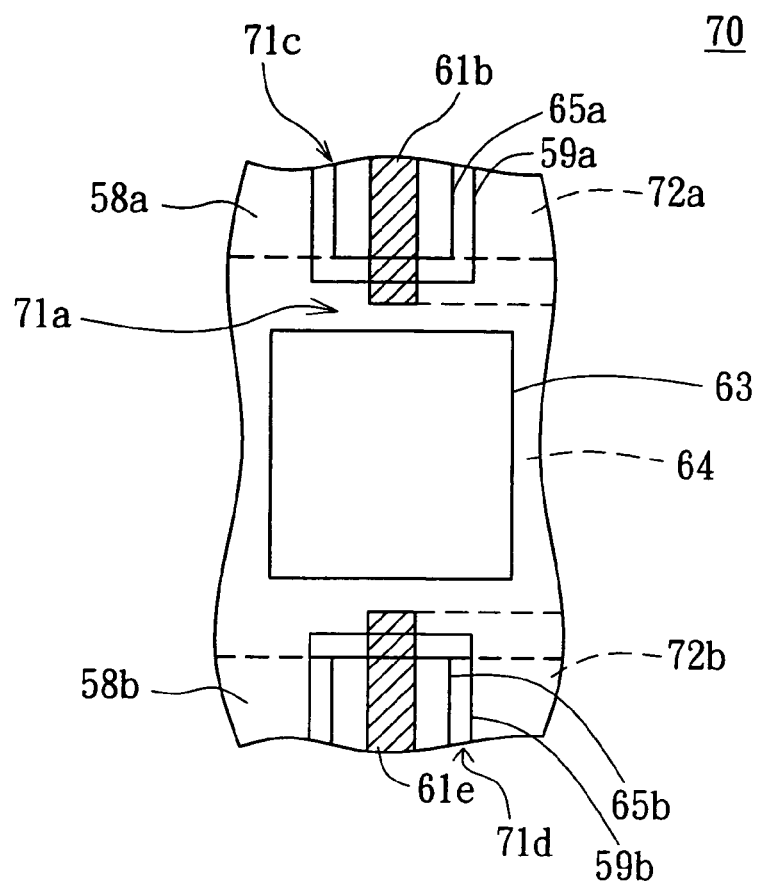
FIG. 7 is a partial enlargement of a top view of the integrated circuit chip along the gap in FIG. 4.

Refer to FIG. 6 and FIG. 7 at the same time. FIG. 6 is a partial enlargement of a cross-sectional view of the integrated circuit chip along the cross-sectional line 6–6' in FIG. 4. FIG. 7 is a partial enlargement of a top view of the integrated circuit chip along the gap in FIG. 4. In FIG. 6 and FIG. 7, the seal ring 71 further includes an N type doping layer 63 and an isolation layer 64. An aperture 58c is formed between the first P well 58a and the second P well 58b. The N type doping layer 63 is formed in the aperture 58c and is formed on the silicon substrate 57. The N type doping layer 63 is used for electrically isolating the first P well 58a and the second P well 58b. An aperture 59c is formed between the first P+ doping layer 59a and the second P+ doping layer 59b. The aperture 59c corresponds to the N type doping layer 63. The isolation layer 64 is formed in the aperture 59c and is formed on the N type doping layer 63. The isolation layer 64 is used for electrically isolating the first P+ doping layer 59a and the second P+ doping layer 59b. A gap 71a is formed between the metal layers 61a~61c, the contact layer 62a~62c and the metal layers 61d~61f, the contact layers 62d~62f. The gap 71a exposes partial surface of the isolation layer 64. The dielectric layer 60a~60c are formed on the isolation layer 64 in the gap 63 according to a bottom-up sequence. The dielectric layer is used for electrically isolating the metal layers 61a~61c, the contact layer 62a~62c and the metal layers 61d~61f, the contact layers 62d~62f. An active region 65a formed underneath the first seal ring 71c adjacent to the gap 71a and an active region 65b formed underneath the second seal ring 71d adjacent to the gap 71a are isolated by the N type doping layer 63. The N type doping layer 63 can be a N well or a N-epi. The isolation layer 64 can be a shallow trench isolation (STI) layer or a field oxide layer.

It can be understood from FIG. 6 that the seal ring 71 of the invention at least includes the first P well 58a, the second P well 58b, the N type doping layer 63, the first P+ doping layer 59a, the second P+ doping layer 59b, the isolation layer 64, the contact layers 62a~62b and the dielectric layer 60a. The first P well 58a is formed on the silicon substrate 57. The second P well 58b is formed near the first P well 58a. The N type doping layer 63 is formed between the first P well 58a and the second P well 58b, so that the first P well 58a and the second P well 58b are electrically isolated by the N type doping layer 63. The first P+ doping layer 59a is formed on the first P well 58a. The second P+ doping layer 59b is formed on the second P well 58b. The isolation layer 64 is formed between the first P+ doping layer 59a and the second P+ doping layer 59b, so that the first P+ doping layer 59a and the second P+ doping layer 59b are electrically isolated by the isolation layer 64. The metal layer 61a is directly or indirectly formed on the first P+ doping layer 59a and is electrically connected with the first P+ doping layer 59a. The metal layer 61d is directly or indirectly formed on the second P+ doping layer 59b and is electrically connected with the second P+ doping layer 59b. The dielectric layer 60a is formed between the metal layers 61a and 61d, so that the metal layers 61a and 61d are electrically isolated by the dielectric layer 60a.

Refer to FIG. 6. Since the N type doping layer 63 underneath the gap 71a is formed between the first P well 58a and the second P well 58b, a first PN junction are formed between the N type doping layer 63 and the first P well 58a at the interface of the first seal ring 71c and the gap 71a. A second PN junction is formed between the N type doping layer 63 and the second P well 58b at the interface of the second seal ring 71d and the gap 71a. The first PN junction and the second PN junction are linked and are inverse. Consequently, the noise cannot be transmitted from the first seal ring 71c formed at one side of the gap 71a to the second seal ring 71d formed at opposite side of the gap 71a through the N type doping layer 63, effectively preventing the noise generated by the digital circuit 73 from being transmitted to the RF circuit 74 through the seal ring 71. Besides, the electric charges generated during the process of manufacturing seal ring 71 according to the plasma etching method can be transmitted to the silicon substrate 57 through the first P+ doping layer 59a and the first P well 58a and through the second P+ doping layer 59b and the second P well 58b, lest the electric charges might build up on the seal ring 71 and affect the electrical characteristics of the integrated circuit chip 70.

Figure 8A:
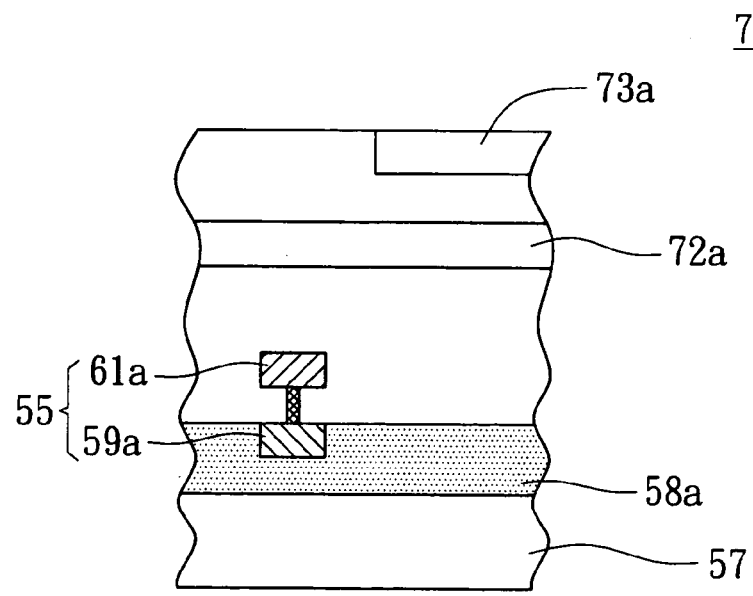
FIG. 8A is a partial enlargement of a cross-sectional view of the integrated circuit chip along the cross-sectional line 8A–8A' in FIG. 4.

Referring to FIG. 8A, a partial enlargement of a cross-sectional view of the integrated circuit chip along the cross-sectional line 8A–8A' in FIG. 4 is shown. Refer to FIG. 5A and FIG. 6 at the same time. In FIG. 8A, the first ground ring 72a is formed between the silicon substrate 57 and the I/O pad 73a. The guard ring 55 surrounds the I/O pad 73a. The guard ring 55 includes the metal layer 61a and the first P+ doping layer 59a. The metal layer 61a is electrically connected with the first P+ doping layer 59a.

Figure 8B:
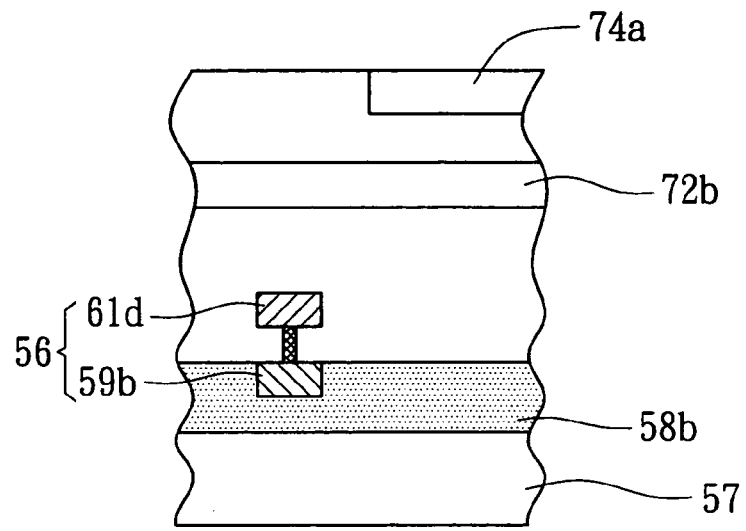
FIG. 8B is a partial enlargement of a cross-sectional view of the integrated circuit chip along the cross-sectional line 8B–8B' in FIG. 4.

Referring to FIG. 8B, a partial enlargement of a cross-sectional view of the integrated circuit chip along the cross-sectional line 8B–8B' in FIG. 4 is shown. Refer to FIG. 5B and FIG. 6 at the same time. In FIG. 8B, the second ground ring 72b is formed between the silicon substrate 57 and the I/O pad 74a. The guard ring 56 surrounds the I/O pad 74a. The guard ring 56 includes the metal layer 61d and the second P+ doping layer 59b. The metal layer 61d is electrically connected with the second P+ doping layer 59b.

Since capacity effect exists between the I/O pad 73a and the first P well 58a formed underneath the I/O pad 73a, when the I/O pad 73a receives the noise, the noise will be coupled with the first P well 58a formed underneath the I/O pad 73a first, then transmitted to the first seal ring 71c and the first ground ring 72a through the guard ring 55 formed around the I/O pad 73a. Since capacity effect also exists between the I/O pad 74a and the second P well 58b formed underneath I/O pad 74a, when the I/O pad 74a receive noise, the noise will be coupled with the second P well 58b formed underneath the I/O pad 74a first, then transmitted to the second seal ring 71d and the second ground ring 72b through the guard ring 56 formed around the I/O pad 74a. Thus, the noise received by the I/O pads 73a and 74a will be effectively excluded. Besides, the noise transmitted from the external of the guard ring 55 can also be transmitted to the first seal ring 71c and the first ground ring 72a through the guard ring 55, lest the I/O pad 73a might be interfered with. The noise transmitted from the external of the guard ring 56 can also be transmitted to the second seal ring 71d and the second ground ring 72b through the guard ring 56, lest the I/O pad 74a might be interfered with. Thus, the guard rings 55 and 56 can promptly transmit the noise generated from around the guard rings 55 and 56 to the ground end, preventing the I/O pads 73a and 74a from being interfered with. As for the two adjacent I/O pads, the guard rings formed nearby further prevent the two adjacent I/O pads from generating erroneous signal feedback path.

Figure 9:
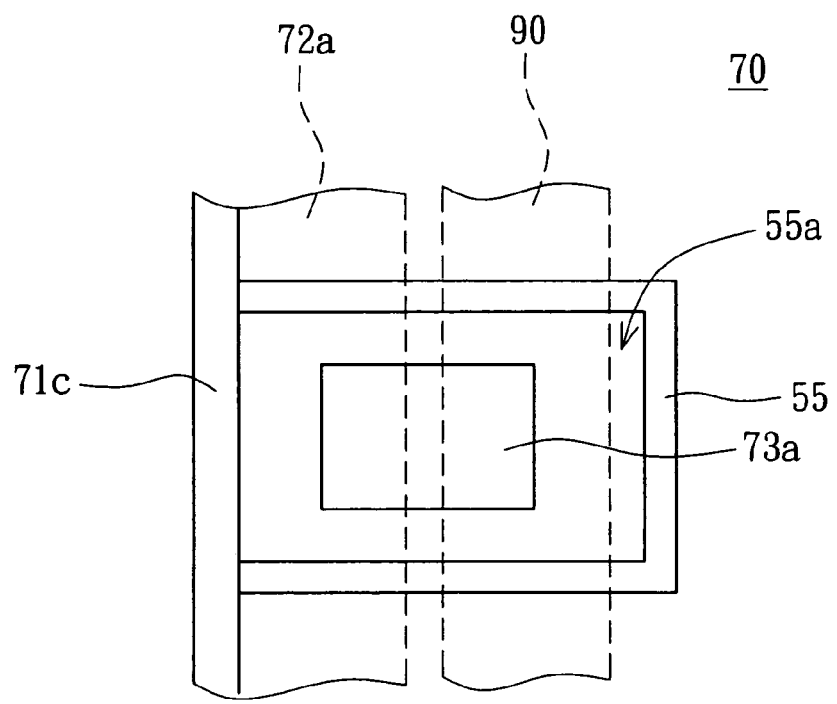
FIG. 9 is a partial enlargement of a top view of the integrated circuit chip in FIG. 4.

Referring to FIG. 9, a partial enlargement of a top view of the integrated circuit chip in FIG. 4 is shown. In FIG. 9, an integrated circuit chip 70 further includes a power ring 90. The power ring 90 and the first ground ring 72a are partly formed underneath the I/O pad 73a. Each of the power ring 90 and the first ground ring 72a roughly correspond to a half of the bottom surface of the I/O pad 73a. Apart from the conventional function of serving as the grounding and power of a circuit, the power ring 90 and the first ground ring 72a, which look like two metal rings, can serve as a shielding between the I/O pad 73a and the first P well 58a in FIG. 8, blocking mutual noise interference. Similarly, another power ring and the second ground ring 72b are formed underneath the I/O pad 74a, serving as a shielding between the I/O pad 74a and the second P well 58b to block mutual noise interference.

The integrated circuit chip disclosed in the above preferred embodiment according to the invention reduces noise coupling, prevents electric charges, and improves the electrical characteristics of the integrated circuit chip by means of a design of mutual electrical connection between the seal ring, the ground ring and the guard ring.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A seal ring, which extends along the peripheral of a silicon substrate, the seal ring comprising:
   a P well, which is formed on the silicon substrate and has a first aperture;
   an N type doping layer, which is formed in the first aperture and is formed on the silicon substrate;
   a P+ doping layer, which is formed on the P well and has a second aperture corresponding to the N type doping layer;
   an isolation layer, which is formed in the second aperture and is formed on the N type doping layer;
   a plurality of dielectric layers, which is formed on the P+ doping layer; and
   a plurality of metal layers, each of which is formed on the corresponding dielectric layer and is electrically connected with the P+ doping layer, wherein the metal layers have a gap exposing part of the isolation layer.

2. The seal ring according to claim 1, further comprising:
   a plurality of contact layers, each of which is formed on the corresponding dielectric layer, wherein one of the contact layers is electrically connected with the P+ doping layer and the metal layer adjacent to the P+ doping layer, wherein each of the remaining contact layers are electrically connected with the two adjacent metal layers.

3. The seal ring according to claim 2, wherein the contact layers are a plurality of vias or plugs.

4. The seal ring according to claim 1, wherein the size of the second aperture is larger than or equal to the area of the surface of the N type doping layer.

5. The seal ring according to claim 1, wherein the surface of the N type doping layer is co-planar with the surface of the P well.

6. The seal ring according to claim 1, wherein the surface of the isolation layer is co-planar with the surface of the P+ doping layer.

7. The seal ring according to claim 1, wherein the N type doping layer is an N well layer or an N-epi layer.

8. The seal ring according to claim 1, wherein the isolation layer is a shallow trench isolation (STI) layer or a field oxide layer.

9. A seal ring, which extends along the peripheral of a silicon substrate, the seal ring comprising:
   a first P well, which is formed on the silicon substrate;
   a second P well, which is formed near the first P well;
   a N type doping layer, which is formed between the first P well and the second P well to electrically isolate the first P well and the second P well;
   a first P+ doping layer, which is formed on the first P well;
   a second P+ doping layer, which is formed on the second P well;
   an isolation layer, which is formed between the first P+ doping layer and the second P+ doping layer to electrically isolate the first P+ doping layer and the second P+ doping layer;
   a first metal layer, which is directly or indirectly formed on the first P+ doping layer and is electrically connected with the first P+ doping layer;
   a second metal layer, which is directly or indirectly formed on the second P+ doping layer and is electrically connected with the second P+ doping layer; and
   a dielectric layer, which is formed between the first metal layer and the second metal layer to electrically isolated the first metal layer and the second metal layer electrically.

10. The seal ring according to claim 9, further comprising:
    a first dielectric layer and a first contact layer, both of which are formed between the first metal layer and the first P+ doping layer, wherein the first metal layer is electrically connected with the first P+ doping layer through the first contact layer; and
    a second dielectric layer and a second contact layer, both of which are formed between the second metal layer and the second P+ doping layer, wherein the second metal layer is electrically connected with the second P+ doping layer through the second contact layer.

11. The seal ring according to claim 10, wherein the first contact layer is a plug or a via.

12. The seal ring according to claim 10, wherein the second contact layer is a plug or a via.

13. The seal ring according to claim 9, wherein the isolation layer is an STI layer or a field oxide layer.

* * * * *